US007092829B2

(12) United States Patent
Kato et al.

(10) Patent No.: US 7,092,829 B2
(45) Date of Patent: Aug. 15, 2006

(54) INSTANTANEOUS WIRE INTERRUPTION DETECTION SYSTEM FOR VEHICLE ELECTRICAL SYSTEM

(75) Inventors: Masayasu Kato, Nagoya (JP); Nobuhiko Makino, Anjo (JP); Hirohisa Fujita, Chita-gun (JP); Toyoharu Katsukura, Kariya (JP)

(73) Assignees: Advics Co., Ltd., Kariya (JP); Denso Corporation, Kariya (JP)

( * ) Notice: Subject to any disclaimer, the term of this patent is extended or adjusted under 35 U.S.C. 154(b) by 0 days.

(21) Appl. No.: 10/766,321

(22) Filed: Jan. 29, 2004

(65) Prior Publication Data
US 2004/0220776 A1 Nov. 4, 2004

(30) Foreign Application Priority Data
Jan. 31, 2003 (JP) .............................. 2003-023572

(51) Int. Cl.
*G01R 31/02* (2006.01)
(52) U.S. Cl. .................. 702/58; 702/185; 324/503; 701/29; 340/652
(58) Field of Classification Search ............ 702/57–59, 702/66, 117, 182, 183–185, 188; 324/503, 324/504, 512, 543; 325/555, 556; 701/29, 701/31, 35; 340/438, 458, 652
See application file for complete search history.

(56) References Cited
U.S. PATENT DOCUMENTS
3,601,655 A * 8/1971 Andersen .................. 361/1
5,568,529 A * 10/1996 Masuda ..................... 377/16
5,629,606 A * 5/1997 Asada ....................... 322/28
5,848,365 A * 12/1998 Coverdill ................... 701/35
6,745,153 B1 * 6/2004 White et al. .............. 702/184

FOREIGN PATENT DOCUMENTS
DE    10225658      12/2003
EP    0 506 832 B1  4/1994
JP    2001033356 A  * 2/2001
JP    A-2001-065403 3/2001

* cited by examiner

Primary Examiner—Marc S. Hoff
Assistant Examiner—Manuel L Barbee
(74) Attorney, Agent, or Firm—Posz Law Group, PLC

(57) ABSTRACT

In an instantaneous wire interruption detection system for a vehicle electrical system, a VSC-ECU includes an input processing circuit that processes electric signals transmitted from various sensors and an EFI-ECU by a signal wire (wire harness); a signal state determination circuit that determines whether the electric signals processed by the input processing circuit are normal or abnormal; a latch circuit that latches the determination result as a latch signal; and an output circuit that can output the latch signal. When a signal abnormality is detected by the signal state determination circuit, the latch circuit is able to generate the latch signal in synchronization therewith, and latch the latch signal for a predetermined time. Accordingly, for example, by connecting a tester device to the output circuit, and monitoring the latch signal, it is possible to detect instantaneous wire interruption of the electrical system.

8 Claims, 3 Drawing Sheets (a) SENSOR SIGNAL (b) LATCH SIGNAL (SIGNAL ABNORMALITY DETECTION)

INSTANTANEOUS WIRE INTERRUPTION DETECTION SYSTEM FOR VEHICLE ELECTRICAL SYSTEM

CROSS REFERENCE TO RELATED APPLICATION

This application is based upon and claims the benefit of Japanese Patent Application No. 2003-23572 filed on Jan. 31, 2003, the content of which is incorporated herein by reference.

FIELD OF THE INVENTION

The present invention relates to an Instantaneous wire interruption detection system for an electrical system of a vehicle that can detect instantaneous wire interruption that occurs in the electrical system of the vehicle due to a temporary contact failure.

BACKGROUND OF THE INVENTION

Related art has been disclosed such as a fault diagnosis device for an electronic control unit of an automobile in Japanese Patent Laid-Open Publication 2001-065403. In this related art, a fault diagnosis device incorporated in an electronic control unit (hereinafter referred to as "ECU") detects abnormality (wire disconnection) of a wire harness connected to the ECU. More particularly, it is determined whether a signal (sensor signal) input to the ECU via the wire harness is within a normal range, and if it is determined (a provisional determination) that the signal is outside the normal range, a value of an abnormality determination counter is incrementally increased. Following this, it is determined whether the value of the abnormality determination counter has exceeded a predetermined value. In the case that the predetermined value has been exceeded (for example, there have been four provisional determinations in a row), it is finally determined that a fault has occurred.

However, with the above described related art, until the abnormality determination counter exceeds the predetermined value (namely, until a predetermined number of provisional determinations are made), the final fault determination is not made. Accordingly, this art is only able to detect faults in which have an abnormal state continues (for example, a fault of the sensor itself, or a wire disconnection in the wire harness); other faults are not detected. In other words, in the case of a temporary contact failure (instantaneous wire interruption) like a loose contact (a state where a connector fitting is inadequate), the abnormal state does not necessarily continue, and thus the above described related art has the drawback of not being able to address such situations because the temporary contact failure cannot be detected.

Further, in the related art, when the final fault determination is made based on the above described method or the like, the control system that includes the cause of the fault is stopped. Accordingly, checking of the abnormal state at real time is not possible, and it is difficult to identify the cause of the fault.

SUMMARY OF THE INVENTION

The present invention has been conceived of in the light of the aforementioned circumstances, and an object thereof is to provide an instantaneous wire interruption detection system for an electrical system of a vehicle that can detect instantaneous wire interruption (a temporary contact failure) that occurs in the electrical system of the vehicle due to the temporary contact failure.

Moreover, another object of the present invention is to provide an instantaneous wire interruption detection system that can check an abnormal state at real time without stopping a control system.

According to an aspect of the invention, an instantaneous wire interruption detection system for an electrical system of a vehicle includes a signal abnormality detection portion and a holding portion. The signal abnormality detection portion detects a signal abnormality, which is defined as a change of an electric signal from normal to abnormal. The signal is input via a signal wire to the signal abnormality detection portion from a signal generation portion that generates electric signals. Further, when the signal abnormality detection portion detects the signal abnormality, the holding portion latches this detection result as a latch signal.

According to this configuration, when the signal abnormality detection portion detects a signal abnormality, this detection result is latched by the holding portion. Accordingly, for example, it is possible to detect a signal abnormality (instantaneous wire interruption) caused by a temporary contact failure, such as a loose contact. Thus, it is possible to conduct instantaneous wire interruption detection for the electrical system in a short period of time at a vehicle dealer, a service center (a repair center), or the like.

The instantaneous wire interruption detection system for an electrical system of a vehicle may also include a warning device that issues a warning when the signal abnormality is detected.

According to this configuration, it is possible to specify using the warning of the warning device a portion of the electrical system in which instantaneous wire interruption has occurred, thus causing the signal abnormality. Accordingly, it is possible to rapidly conduct inspection and repair. Further, as the warning device, it is possible to utilize methods such as, for example, a lamp that lights, or a buzzer that sounds.

BRIEF DESCRIPTION OF THE DRAWINGS

Other objects, features and advantages of the present invention will be understood more fully from the following detailed description made with reference to the accompanying drawings. In the drawings.

DETAILED DESCRIPTION OF THE PREFERRED EMBODIMENTS

Figure 1:
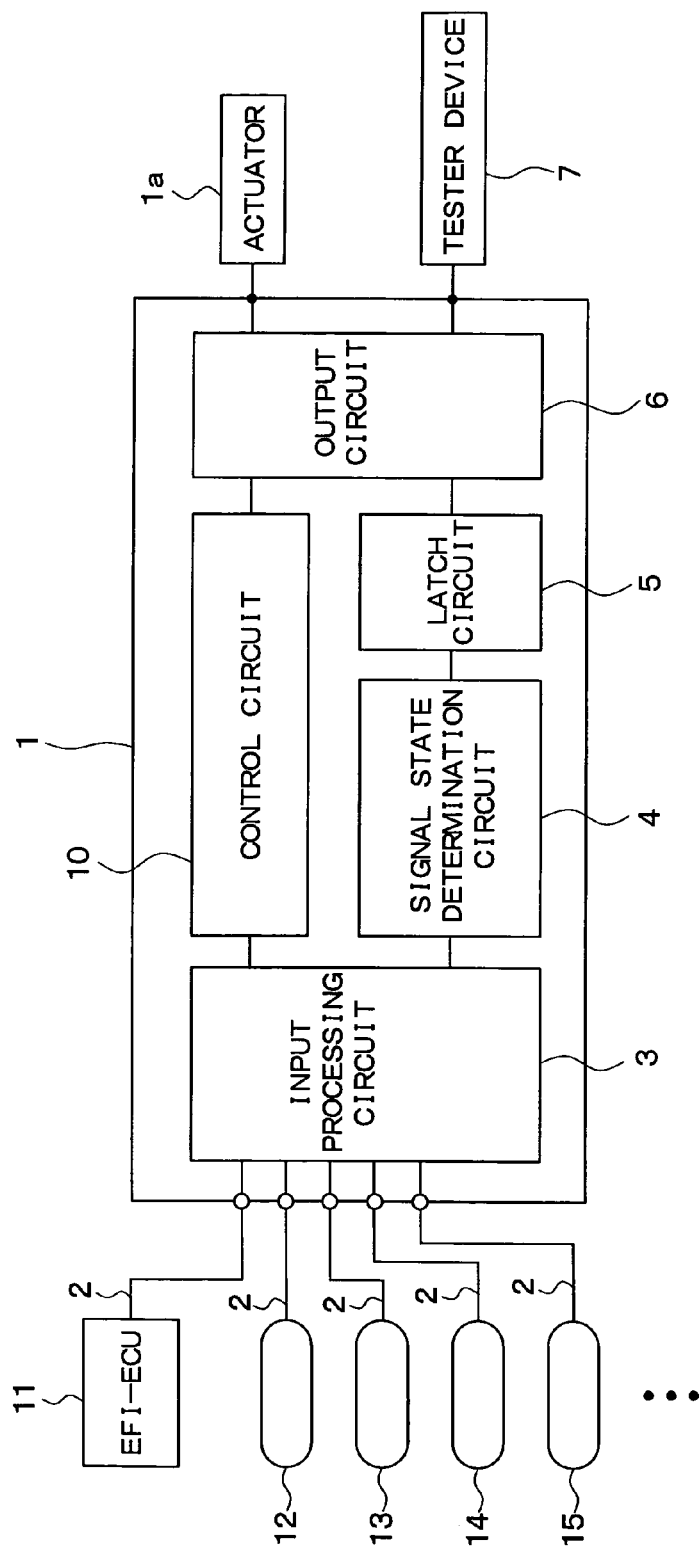
FIG. 1 is a schematic block diagram of an instantaneous wire interruption detection system for an electrical system of a vehicle.

The present invention will be described further with reference to various embodiments in the drawings.

Hereinafter, an embodiment of the present invention will be described with reference to the drawings.

In this embodiment, an example is described in which an instantaneous wire interruption detection system (hereinafter referred to as the "system") for an electrical system of a vehicle, namely, an instantaneous wire interruption detection system that detects a temporary contact failure (instantaneous wire interruption) that occurs in an electrical system of a vehicle, is incorporated within a control system of a side slip control device. The side slip control device executes a so-called vehicle stability control (VSC) that ensures stability when the vehicle is turning, or the like. Hereinafter, the control system of the side slip control device will be referred to by the abbreviation "VSC system".

FIG. 1 is a schematic block diagram showing a state when a tester device 7 for instantaneous wire interruption detection is connected to the VSC system.

The VSC system is configured to include a VSC-ECU 1; an actuator 1a driven by the VSC-ECU 1; an EFI-ECU (electronic control device) 11 that controls a fuel supply device (electronic fuel injector) connected to the VSC-ECU 1 via a signal wire 2; and various sensors 12 to 15 (hereinafter referred to as the "plurality of sensors 12 to 15") that detect a vehicle state during turning. The plurality of sensors 12 to 15 are, more specifically, a vehicle speed sensor 12, a yaw rate sensor 13, a G-sensor 14, and a steering sensor 15. The plurality of sensors 12 to 15 output respective electric signals that indicate respective detection results related to vehicle speed, yaw rate, acceleration, and steering angle. Each electric signal is input to the VSC-ECU 1 via the signal wire 2.

In order to execute VSC based upon an electric signal from the EFI-ECU 11 indicating a fuel supply amount, and the respective detection signals from the plurality of sensors 12 to 15, the VSC-ECU 1 functions so as to output a control signal for the actuator 1a, and execute an instantaneous wire interruption detection for the VSC system.

More specifically, the VSC-ECU 1 is configured so as to include an input processing circuit 3, a control circuit 10, a signal state determination circuit 4, a latch circuit 5, and an output circuit 6.

The input processing circuit 3 processes the electric signals received from the EFI-ECU 11 and the plurality of sensors 12 to 15 via the signal wire 2.

The control circuit 10 executes various calculations based upon the electric signals from the plurality of sensors 12 to 15 that have been processed by the input processing circuit 3. Then, the control circuit 10 determines whether it is necessary to execute VSC based upon the calculation results, and in the case that VSC is to be executed, generates a control signal therefor.

The signal state determination circuit 4 determines whether the electric signals processed by the input processing circuit 3 are normal or abnormal, and corresponds to a signal abnormality detection portion of the present invention. The signal state determination circuit 4 receives the electric signals (pulse signals) processed by the input processing circuit 3, and determines that the signals are normal if the pulse signals are consecutively input at a fixed time interval. On the other hand, despite the fact that the electric signals from the EFI-ECU 11 and the plurality of sensors 12 to 15 are being generated, the signal state determination circuit 4 determines that the signals are abnormal if the pulse signals processed by the input processing circuit 3 are input at a time interval longer than the fixed time interval, or are interrupted. In this case, switching of the electric signals from normal to abnormal, namely, a signal abnormality, is detected by the signal state determination circuit 4, and a signal is output that indicates that an electric signal abnormality has been determined.

When the abnormal state is determined by the signal state determination circuit 4, the latch circuit 5 latches the determination result as a latch signal. The latch circuit 5 corresponds to a holding portion of the present invention. The latch circuit 5 is configured such that, when the signal abnormality is detected by the signal state determination circuit 4, the latch signal is generated in synchronization therewith, and is latched for a predetermined time.

Figure 2:
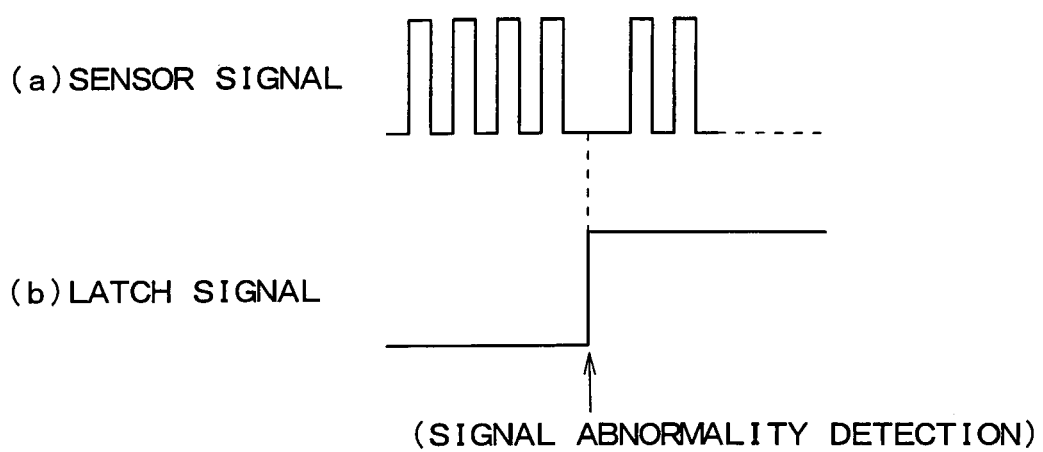
FIG. 2 is an output chart of a sensor signal and a latch signal that illustrates a function of a latch circuit.

FIG. 2 shows a relationship between one of the electric signals (the sensor signals) from the plurality of sensors 12 to 15 and the latch signal when an abnormality is detected. As shown in FIG. 2, in a normal state, the sensor signal repeatedly switches between ON and OFF with a predetermined cycle. However, if an abnormal state is entered due to instantaneous wire interruption of the signal wire 2, at this time, the sensor signal stops repeatedly switching between ON and OFF as shown, for example, in FIG. 2. This state is detected by the signal state determination circuit 4 as an abnormal state, and the latch signal is latched by the latch circuit 5. Note that, as shown in FIG. 2, following detection of the abnormal state, the latch signal becomes a constant level (a high level) that indicates the abnormal state. However, after a predetermined period has elapsed, the latch signal returns to its original level (a low level).

The output circuit 6 receives the control signal generated by the control circuit 10 and outputs this control signal to the actuator 1a, and also outputs the latch signal latched by the latch circuit 5. This output circuit 6 is configured such that the tester device 7, which corresponds to an external connection unit of the invention, can be connected to the output circuit 6 so that the tester device 7 receives the latch signal output from the output circuit 6.

Moreover, the tester device 7 can be assembled to the output circuit 6 at a vehicle dealer, a service center (a repair center), or the like, in the case that an instantaneous wire interruption failure, or the like, of the VSC system occurs. The tester device 7 is provided with a warning device (not shown) that issues a warning, such as a lamp that lights, or a buzzer that sounds, when the latch signal is input.

The actuator 1a is configured from an ABS actuator provided with, for example, a solenoid-controlled valve, a motor, and the like. By driving the solenoid-controlled value and the motor in accordance with the output signal from the VSC-ECU 1, the actuator 1a can adjust a brake force generated for each wheel.

Next, a procedure for instantaneous wire interruption detection will be explained with reference to FIGS. 3 and 4.

Figure 3:
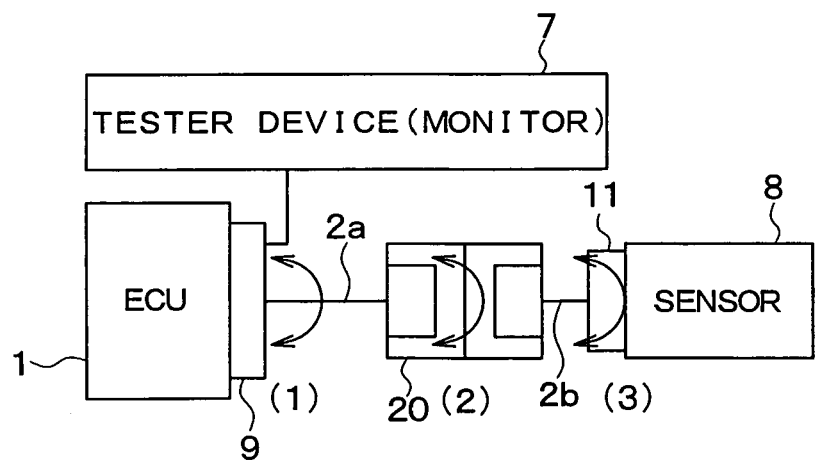
FIG. 3 is a block diagram of an instantaneous wire interruption detection system that adopts a tester device.

FIG. 3 shows a sensor 8, which is taken as representative of the plurality of sensor 12 to 15 that are connected to the VSC-ECU 1. Instantaneous wire interruption detection is executed by the sensor 8, and the other sensors and the EFI-ECU 11, using the same procedure. It should be noted that, here, an explanation will be presented for a configuration in which the sensor 8 is connected to the VSC-ECU 1 via an intermediate connector 20, as shown in FIG. 3; in particular, one side of the intermediate connector 20 is connected to the VSC-ECU 1 by a signal wire (wire harness) 2a, and the other side of the intermediate connector 20 is connected to the sensor 8 via a signal wire (wire harness) 2b.

Figure 4:
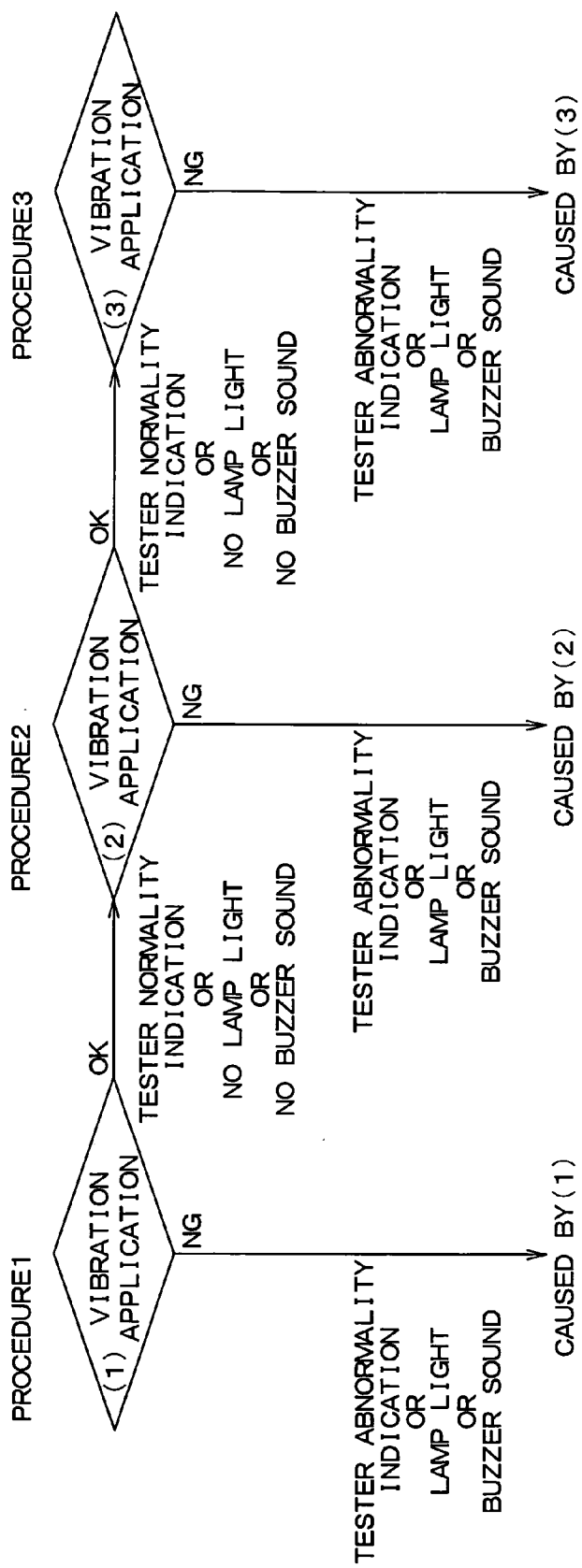
FIG. 4 is a flow chart showing a procedure for instantaneous wire interruption detection.

Abnormality detection is executed in accordance with the procedure shown in 1 to 3 of FIG. 4. This abnormality detection is executed, for example, when instantaneous wire interruption, or the like, occurs at some portion of the VSC system, and the operator becomes aware of this failure, or when the tester device 7 is connected to the output circuit 6 of the VSC-ECU 1 when an inspection is carried out at the vehicle dealer, the service center (the repair center), or the like. FIG. 4 shows a diagrammatic outline of procedures 1 to 3.

[Description of the Procedure 1]

As shown in FIG. 4, in the procedure 1, vibration is applied to a portion (1) shown in FIG. 3, namely, a connector 9 connected to the VSC-ECU 1, and the wire harness 2a, and the latch signal is monitored using the tester device 7. At this point, if a temporary contact failure (instantaneous wire interruption) occurs, at the same time as the signal abnormality is detected by the signal state determination circuit 4, the latch circuit 5 latches this detection result as the latch signal (refer to FIG. 2). When this latch signal is received by the tester device 7, the warning device (the lamp, the buzzer, or the like) provided in the tester device 7 issues a warning, enabling confirmation of the fact that an instantaneous wire interruption has occurred.

In this case, since a fitting failure (loose contact) of the connector 9 is a possible cause of the instantaneous wire interruption, the connection state of the connector 9 is checked, and if there is a fitting failure of the connector 9, fitting is securely executed. Following this, once again, vibration is applied to the connector 9 and the wire harness 2a, and the latch signal is monitored using the tester device 7. At this point, if no warning is issued by the warning device of the tester device 7, it is determined that the cause of the instantaneous wire interruption was a fitting failure of the connector 9.

[Description of the Procedure 2]

Next, as shown in FIG. 4, in the procedure 2, vibration is applied to a portion (2) as shown in FIG. 3, namely, the intermediate connector 20 and the wire harnesses 2a and 2b, and the latch signal is monitored using the tester device 7. In the same way as in the procedure 1 described above, in the case that the warning device of the tester device 7 issues a warning, it is possible that a fitting failure (loose contact) of the intermediate connector 20 is the cause of the instantaneous wire interruption. Accordingly, after the fitting of the intermediate connector 20 is reliably executed, once again, vibration is applied to the intermediate connector 20 and the wire harness 2a and 2b, and the latch signal is monitored using the tester device 7. At this point, if no warning is issued by the warning device of the tester device 7, it is determined that the cause of the instantaneous wire interruption was a fitting failure of the intermediate connector 20.

[Description of the Procedure 3]

Finally, as shown in FIG. 4, in the procedure 3, vibration is applied to a portion (3) shown in FIG. 3, namely, a connector 11 connected to the sensor 8 and the wire harness 2b, and the latch signal is monitored using the tester device 7. In the same way as in the procedure 1 and the procedure 2 described above, in the case that the warning device of the tester device 7 issues a warning, a fitting failure (loose contact) of the connector 11 is a possible the cause of the instantaneous wire interruption. Accordingly, after the fitting of the connector 11 is reliably executed, once again, vibration is applied to the connector 11 and the wire harness 2b, and the latch signal is monitored using the tester device 7. At this point, if no warning is issued by the warning device of the tester device 7, it is determined that the cause of the instantaneous wire interruption was a fitting failure of the connector 11.

In the above described manner, according to the VSC system of the embodiment, if a temporary contact failure (which is not a continuous failure) of the electrical system occurs, a signal abnormality is detected, and it is possible to latch the latch signal so as to indicate the detection of the signal abnormality. Accordingly, by monitoring the latch signal, it is possible to detect a temporary contact failure, such as a loose contact, or the like.

Further, with this VSC system, even in the case that a signal abnormality is detected, there is no need to stop the control system that is the subject of the detection, and thus it is possible to check temporary contact failures at real time. Accordingly, it is possible to reproduce the instantaneous wire interruption of the electrical system at the vehicle dealer, service center (repair center), or the like, with the control system in an operating state. Thus, it is possible to easily identify the portion in which instantaneous wire interruption has occurred using the tester device 7 in a short period of time.

Further, the configuration of the embodiment includes the output circuit 6 in the VSC-ECU 1, and thus it is possible to connect the tester device 7, or the like, as the external connection unit, to this output circuit 6. Accordingly, it is possible to display the portion in which the instantaneous wire interruption of the electrical system has occurred on this tester device 7. Given this, there is no need to provide a display function for specifying the portion in which the instantaneous wire interruption of the electrical system has occurred in the system (the instantaneous wire interruption detection system), and thus the system can be realized at low cost.

(Modifications)

This system is not limited to use in the VSC system that is detailed in the above described embodiment, and may, as is clearly apparent, be applied to other control systems.

For the above described embodiment, an example was given in which the warning device was provided in the tester device 7. However, for example, the warning device may be provided in the control system (in the above case, the VSC system). In this case, when a signal abnormality is detected by the signal state determination circuit 4, the VSC-ECU 1 is able to operate the warning device. Accordingly, when an instantaneous wire interruption occurs in the electrical system, it is possible to make the driver aware of the abnormality at real time.

The input processing circuit 3 converts the input signals into pulse signals. However, the conversion is not limited to pulse signals, and, for example, the input processing circuit 3 may convert the input signals into digital signals that maintain a constant signal level (for example, a 5V voltage). In this case, the signal state determination circuit 4 determines the digital signal to be normal when the digital signal processed by and input from the input processing circuit 3 maintains the fixed signal level. Further, despite the fact that a digital signal is being generated from a signal generation portion (that corresponds to the plurality of sensors 12 to 15 and the EFI-ECU 11 in the above described embodiment), the signal determination circuit 4 is able to determine that the digital signal is abnormal when the digital signal from the signal generation portion is interrupted.

Moreover, the electric signal (the signal generated by the signal generation portion) obtained by the input processing circuit 3 is not limited to being the pulse signal described in the embodiment, or the digital signal maintained at the fixed signal level (an ON state), but may be an analogue signal. Moreover, a signal that accords with a determined communication protocol may be used (for example a signal used in CAN communication). In other words, it is sufficient if interruption of a signal that accords with a pulse signal, a digital signal, a analogue signal, or a communication protocol can be detected as a signal abnormality.

The tester device 7 may be provided with a function that screen displays the portion in which the instantaneous wire interruption has occurred based on the latch signal, rather than having the warning device.

With this system, it is not essential to connect the signal generation portion with the system by the signal wire. Instead, it is possible to input the electric signal generated by the signal generation portion by wireless communication, detect abnormality of this electric signal, and latch this detection result as the latch signal.

While the above description is of the preferred embodiments of the present invention, it should be appreciated that the invention may be modified, altered, or varied without deviating from the scope and fair meaning of the following claims.

What is claimed is:

1. An instantaneous wire interruption detection system for an electrical system of a vehicle that detects an instantaneous wire interruption that occurs in the electrical system of the vehicle due to a temporary contact failure, comprising:
    a signal abnormality detection portion for detecting a signal abnormality, the signal abnormality being temporarily reproduced when a repair center vibrates a signal wire of the vehicle, to provide a detection result; and
    a holding portion for latching the detection result as a latch signal when the signal abnormality detection portion detects the signal abnormality;
    an output circuit for outputting the latch signal; and
    an external connection unit, being connected to the output circuit only when the repair center checks for the signal abnormality so as to receive the latch signal, wherein the external connection unit is provided with a warning device that issues the warning when the signal abnormality is detected.

2. The instantaneous wire interruption detection system for an electrical system of a vehicle according to claim 1, wherein
    an electric signal generated by a signal generation portion is a signal that accords with a determined communication protocol, and
    the signal abnormality detection portion, when the signal that accords with the determined communication protocol is being transmitted from the signal generation portion, determines the normal state to be a state in which the signal that accords with the determined communication protocol is being input continuously, and determines the abnormal state to be a state in which the signal that accords with the determined communication protocol is interrupted, despite the fact that the signal generation portion is transmitting the signal that accords with the determined communication protocol.

3. The instantaneous wire interruption detection system for an electrical system of a vehicle according to claim 1, wherein
    an electric signal generated by a signal generation portion is a digital pulse signal, and
    the signal abnormality detection portion, when the pulse signal is being transmitted from the signal generation portion, determines the normal state to be a state in which the pulse signal is being input continuously at a fixed time interval, and determines the abnormal state to be, one of, a state in which the pulse signal is input at a time interval longer than the fixed time interval, and a state in which the pulse signal is interrupted, despite the fact that the signal generation portion is transmitting the pulse signal.

4. The instantaneous wire interruption detection system for an electrical system of a vehicle according to claim 1, wherein
    an electric signal generated by a signal generation portion is a digital signal that is maintained at a fixed, ON state signal level, and
    the signal abnormality detection portion, when the digital signal is being transmitted from the signal generation portion, determines the normal state to be a state in which the digital signal is being input in the maintained ON state, and determines the abnormal state to be a state in which the digital signal is interrupted, despite the fact that the signal generation portion is transmitting the digital signal.

5. The instantaneous wire interruption detection system for an electrical system of a vehicle according to claim 1, wherein
    an electric signal generated by a signal generation portion is an analogue signal, and
    the signal abnormality detection portion, when the analogue signal is being transmitted from the signal generation portion, determines the normal state to be a state in which the analogue signal is being input continuously, and determines the abnormal state to be a state in which the analogue signal is interrupted, despite the fact that the signal generation portion is transmitting the analogue signal.

6. The instantaneous wire interruption detection system for an electrical system of a vehicle according to claim 1, wherein the holding portion latches the latch signal for a predetermined time.

7. The instantaneous wire interruption detection system for an electrical system of a vehicle according to claim 1, wherein the output circuit is configured for temporary connection to the external connection unit.

8. The instantaneous wire interruption detection system for an electrical system of a vehicle according to claim 1, further comprising an actuator connected to the output circuit, the actuator receiving the latch signal and being configured to operate in accordance with the latch signal.

* * * * *